United States Patent [19]

Meixler

[11] 4,023,114
[45] May 10, 1977

[54] STABLE WIDE DEVIATION LINEAR VOLTAGE CONTROLLED FREQUENCY GENERATOR

[75] Inventor: Lewis Donald Meixler, Hightstown, N.J.

[73] Assignee: RCA Corporation, New York, N.Y.

[22] Filed: Sept. 29, 1975

[21] Appl. No.: 617,718

[52] U.S. Cl. .............................. 331/1 A; 328/155; 331/16
[51] Int. Cl.² ........................................ H03B 3/04
[58] Field of Search ............ 331/1 R, 1 A, 16, 175, 331/177, 18; 328/155; 325/419, 420

[56] References Cited

UNITED STATES PATENTS 3,753,141  8/1973  Van Elk ............................ 331/1 A

Primary Examiner—John Kominski
Attorney, Agent, or Firm—Edward J. Norton; Joseph D. Lazar; Michael A. Lechter

[57] ABSTRACT

A stable, wide-deviation linear voltage controlled frequency generator including a conventional voltage controlled oscillator (VCO) in a control loop which linearizes the output frequency of the VCO. The control loop includes a crystal oscillator and a digital frequency discriminator. The digital frequency discriminator compares the frequency of the VCO output signal with a stable fixed frequency signal from the crystal oscillator to generate a feedback control signal for the VCO. A novel digital frequency discriminator comprising a digital one shot and a low pass filter is disclosed.

6 Claims, 2 Drawing Figures

4,023,114

STABLE WIDE DEVIATION LINEAR VOLTAGE CONTROLLED FREQUENCY GENERATOR

BACKGROUND OF THE INVENTION

1. Field of the Invention

The present invention is directed to a controllable broad-band frequency generator comprising a conventional voltage-controlled oscillator (VCO), and a control loop, the control loop including a digital frequency discriminator and a crystal oscillator reference signal source.

2. Background of the Invention

Telemetry systems often require linear response, voltage-controlled frequency generators. Typically, a conventional voltage-controlled oscillator (VCO) is used for such purposes. However, in various applications, for example in space telemetry, a frequency generator is required not only to be substantially linear in response to applied control voltages over a wide band of frequencies but also to be stable in response for a long period of time. A typical example of such a space telemetry application requires a linear response over a deviation of ±7.5% from the center frequency with stable operation over seven years. Conventional VCOs are incapable of maintaining the above-mentioned requisite linearity and stability of response. For example, in space applications thermal variations, and radiation degradation affect the linearity and stability of a VCO response, in addition to changes in the VCO characteristics due to long term aging. Crystal oscillators maintain requisite stability of response, but are incapable of providing a linear response over a sufficiently wide bandwidth of frequencies. Thus, an engineering dilemma arises.

The prior art has approached the solution to the problem defined by such a dilemma by providing a conventional VCO in a feedback control loop for stabilizing the VCO output frequency response. The feedback loop includes a crystal oscillator frequency source, a frequency discriminator, a difference amplifier, and an integrator circuit. Such a system is disclosed in U.S. Pat. No. 3,753,141, by Van Elk et al., issued Aug. 14, 1973. The Van Elk et al. system, however, utilizes a frequency discriminator comprising digital counters and a D/A converter and is thus disadvantageous in that the control loop feedback voltage from the discriminator to the VCO is necessarily quantized, as opposed to being both continuous and linear. More specifically, the feedback signal generated by the discriminator must be in accordance with one of the possible discrete states of the counter and accordingly only approximates a straight line response by a step staircase. The number of steps in the staircase is determined by the number of bits in the D/A converter.

It is desirable to have a stable, wide-bandwidth, linear frequency generator wherein the feedback signal is continuous and linear, and which utilizes less components than that required in the prior art systems.

SUMMARY OF THE INVENTION

The present invention is directed to a stable, wide-bandwidth, linear voltage-controlled frequency generator comprising a conventional VCO inserted into a feedback control loop for stabilizing the output frequency of the VCO. The control loop includes a frequency discriminator and a crystal reference oscillator. The digital discriminator comprises a digital one-shot and low pass filter, to provide thereby a continuous and linear feedback signal to the VCO.

DETAILED DESCRIPTION OF A PREFERRED EMBODIMENT

Figure 1:
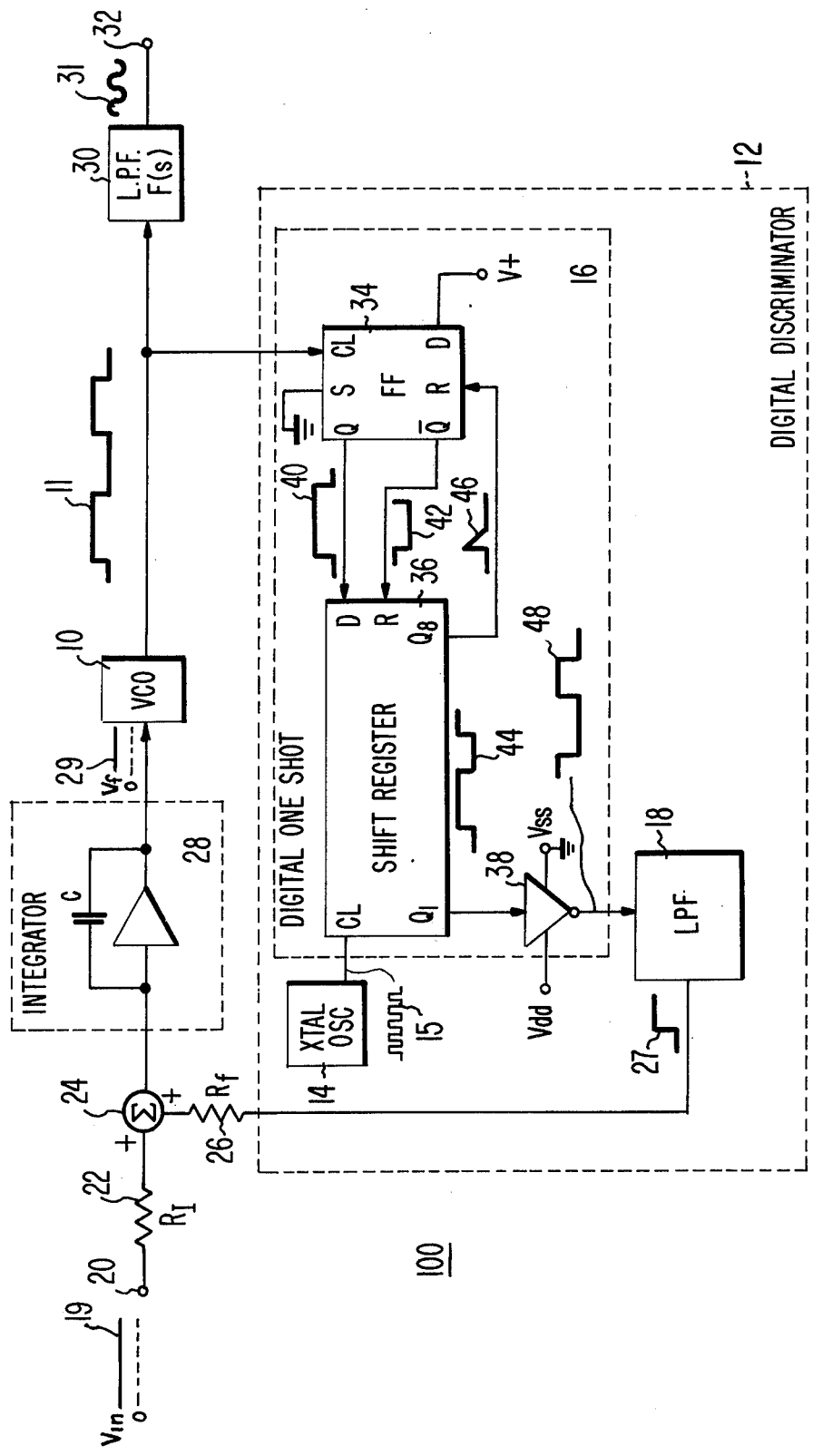
FIG. 1 is a schematic of stable, wide-deviation linear voltage-controlled frequency generator in accordance with the present invention.

FIG. 1 shows a voltage-controlled frequency generator 100 in accordance with the present invention. Frequency generator 100 includes a commercially available, positive-gain VCO 10 connected in a feedback control loop with a digital discriminator 12. An input signal 19 is applied to an input terminal 20 and therefrom through a resistor 22, of value $R_1$, to one input of a conventional two-input summer 24. The second input terminal of summer 24 is connected to a second resistor 26, of value $R_f$, through which is applied the output signal 27 of digital discriminator 12. The output terminal of summer 24 is coupled to a suitable integrator 28, which produces an output signal 29. Resistors 22 and 26, summer 24 and integrator 28 form, in effect, a summing integrator, such as described in Chaptor one, Section 12 of "Electronic Analog and Hybrid Computers" by Korn and Korn, McGraw-Hill, New York, 1964. The integrator output signal 29 is, in turn, applied as a control signal to the control input terminal of VCO 10. The output terminal of VCO 10 is connected to discriminator 12 to complete the control loop, and is further connected to a lowpass filter 30. The output signal 31 of lowpass filter 30, is the output signal of frequency generator 100 and is applied to an output terminal 32. Input signal 19, discriminator output signal 27 and integrator output signal 29 are typically DC signals having voltage levels hereinafter respectively designated $V_{in}$, $V_f$ and $V_I$.

Discriminator 12 includes a crystal oscillator 14, a digital one shot 16, and a lowpass filter 18. Crystal oscillator 14, if desired, may be situated in a remote location, such as a temperature controlled oven. The output terminal of VCO 10 is connected to digital one shot 16, one shot 16 being also receptive of a reference frequency signal 15 from crystal oscillator 14. The output terminal of one shot 16 is coupled through lowpass filter 18 to resistor 26, lowpass filter 18 providing discriminator output signal 27.

Digital one shot 16 comprises commercially available components: a D-type flip flop (FF) 34, having clock (CL), data (D), set (S) and reset (R) input terminals, and Q and $\overline{Q}$ output terminals; a shift register 36, comprising a plurality of stages, typically eight, and having serial-data (D), clock (CL) and reset (R) input terminals, and a Q output terminal from each stage ($Q_1$–$Q_8$); and an inverting buffer 38, having a data input and a data output terminal and, further, being receptive of a stable reference voltage, $V_{dd}$, and a ground potential, $V_{ss}$, typically zero volts. The output terminal of VCO 10 is connected to the clock input terminal CL of FF 34. The D input terminal and set input terminal S of FF 34 are respectively coupled to a voltage source having a value indicative of a logic one ($V^+$) and to a ground potential indicative of logic 0. The Q and $\overline{Q}$ output terminals of FF 34 are respectively connected to the data input terminal and the reset terminal of shift register 36. The clock input terminal CL of shift register 36 is connected to crystal oscillator 14. The Q output terminals of the last stage and first stage of shift register 36, denoted respectively as $Q_8$ and $Q_1$ in FIG. 1, are connected respectively to the reset terminal of FF 34, and to the data input terminal of inverting buffer 38. The data output terminal of inverting buffer 38 is, in turn, coupled to lowpass filter 18.

In the overall operation of frequency generator 100, the frequency of frequency generator output signal 31 is controlled by voltage $V_{in}$ of input signal 19 and discriminator 12 serves to stabilize and linearize the response of frequency generator 100 to $V_{in}$. In general, input signal 19 is summed with discriminator output signal 27, signal 27 hereinafter being termed the "feedback" signal. Resistors 22 and 26 serve to "weight" the input and feedback signals and are assumed in the immediately following discussion to be of equal value ($R_i = R_f$). The sum of voltages $V_{in}$ and $V_f$ of signals 19 and 27 is integrated by integrator 28 to provide the control signal 29 for VCO 10. VCO 10 has a positive gain, such gain hereinafter denoted $K_0$. Accordingly, the VCO output frequency, $f_{VCO}$, is directly proportional to voltage $V_I$ of control signal 29. As $V_{in}$ increases $V_I$ tends to increase and, accordingly, cause $f_{VCO}$ to increase. Similarly, a decrease in $V_{in}$ will cause $f_{VCO}$ to decrease. Feedback signal 27 provides a negative feedback to VCO 10 to stabilize and linearize VCO output signal 11. Feedback signal 27, of negative sense, increases or decreases in voltage magnitude as the VCO output frequency $f_{VCO}$ respectively increases or decreases, in turn, respectively decreasing or increasing $V_I$ until an equilibrium value of $f_{VCO}$ is achieved, i.e., such that $V_{in}+V_f=0$. Thus, for a given input voltage $V_{in}$, if the VCO characteristics change, due to age, changes in temperature, or radiation degradation, such changes are compensated for by the feedback signal 27 from discriminator 12. Low pass filter 30 converts VCO output signal 11 into a sine wave output signal 31.

For example, assume frequency generator 100 to be initially at equilibrium. In such case $V_f = V_{in}$ and $V_I$ is constant. If $V_{in}$ is thereafter increased, summer 24 generates a positive voltage and a positive "ramp" is thus added to $V_I$. As $V_I$ increases, $f_{VCO}$ increases, causing the magnitude of $V_f$ to increase until $V_f+V_{in}=0$ once more. Thus, $f_{VCO}$ and, accordingly, the frequency of output signal 31, is controlled by $V_{in}$.

If frequency generator 100 is initially in equilibrium for a given $V_{in}$ and $f_{VCO}$ drifts in, for example, a positive direction for some reason other than an increase in $V_{in}$, the resultant increase in magnitude of $V_f$ will cause a negative voltage ramp to be added to $V_I$, thereby decreasing $f_{VCO}$. Thus, the response of frequency generator 100 is linearized and stabilized.

The transfer function between the VCO output frequency $f_{VCO}$ and the voltage $V_{in}$ of input signal 19 is determined, as will be explained, to a great extent by the transfer function or gain of digital discriminator 12. In accordance with the present invention, discriminator 12 is a purely digital device having a constant, linear transfer function not substantially affected by temperature, radiation or aging. In general, digital one shot 16 generates a bilevel signal 48 (see FIG. 2) which maintains a duty cycle directly proportioal to the period of VCO output signal 11. Low pass filter 18 then derives the average voltage of such signal 48, to provide feedback signal 27.

Figure 2:
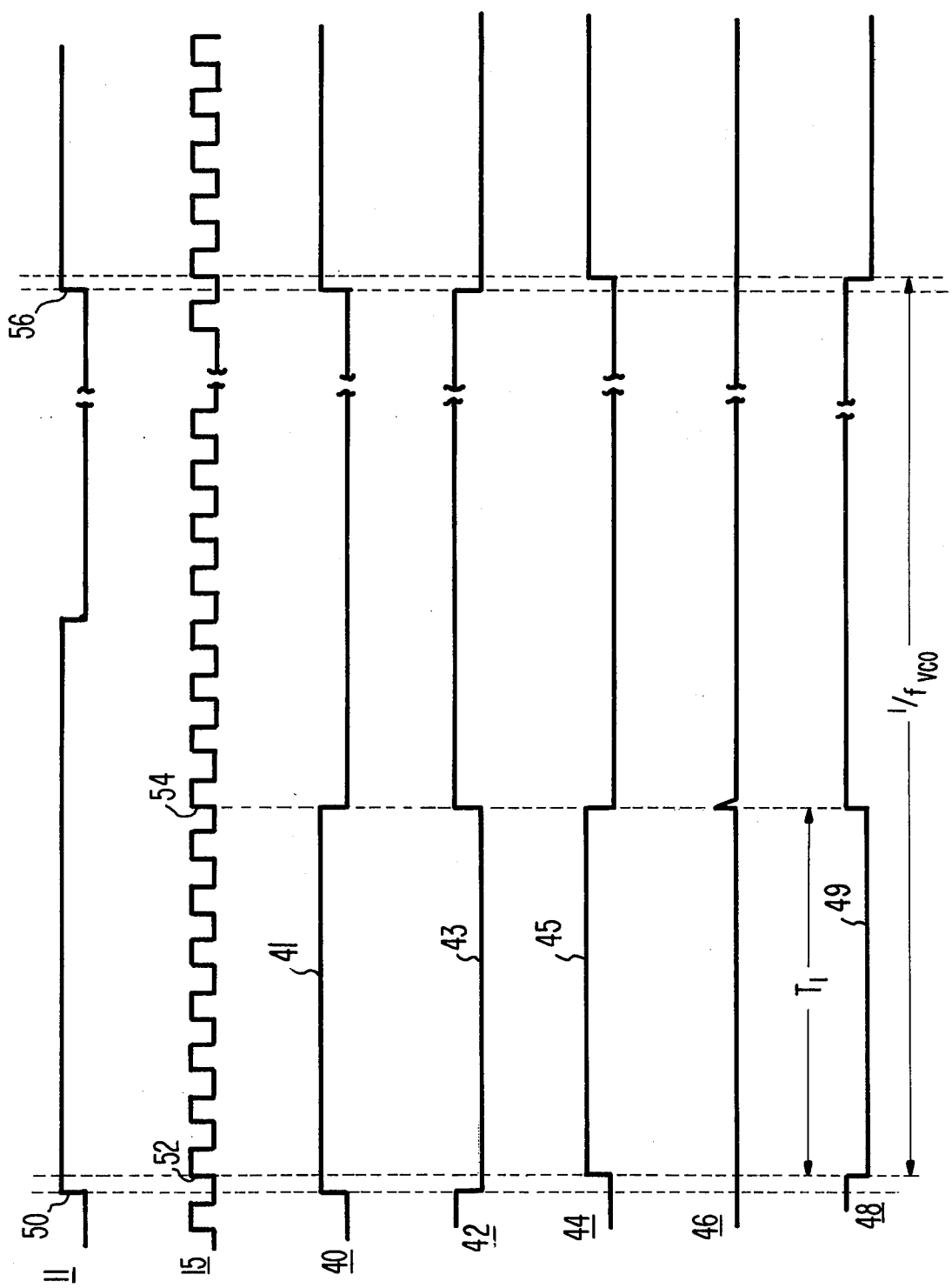
FIG. 2 shows the various waveforms associated with the operation of the frequency generator of FIG. 1.

The specific operation of digital discriminator 12 is now described with reference to FIGS. 1 and 2. FIG. 2 shows, in time relation, typical waveforms of: VCO output signal 11; reference frequency signal 15; signals 40 and 42 respectively generated by FF 34 at its respective Q and $\overline{Q}$ output terminals; signals 44 and 46 respectively provided at the Q output terminals $Q_1$ and $Q_8$ of the first and last stages of shift register 36; and the one shot output signal 48 provided at the data output terminal of inverting buffer 38. It is to be noted, however, that the frequencies of the respective waveforms of FIG. 2 are chosen to simplify the illustrations. In practice the frequencies of signals 11 and 15 are typically in the tens and hundreds of KHz, respectively.

One shot output signal 48 alternates in voltage between stable reference voltage Vdd and ground potential $V_{ss}$, and maintains a duty cycle in accordance with the period of the VCO output signal 11. Positive going transition 50 in VCO output signal 11 clocks FF 34, causing the Q and $\overline{Q}$ output terminals thereof to respectively assume logic one and logic zero states, indicated by portions 41 and 43 of waveforms 40 and 42 respectively. As noted above, the Q output terminal of FF 34 is connected to the serial data input terminal (D) of shift register 36. The logic level applied to such data terminal (D) is loaded into the first register stage and thereafter shifted in sequence to the next successive stage in response to each positive-going transition in reference frequency signal 15 applied to the clock input terminal (CL) of register 36. Accordingly, with signal 40 at a logic one level, the next succeeding positive-going transition 52 of reference frequency signal 15 will cause the logic one state to be loaded into the first stage of shift register 36. $Q_1$ output signal 44 of shift register 36 will thus assume logic one level, as indicated by portion 45 thereof. Inverting buffer 38 provides a voltage at its output terminal which is either equal to Vdd or ground potential ($V_{ss}$) in accordance with the complement of the instantaneous logic level of $Q_1$ output signal 44. Inverting buffer 38, thus clamps the one shot output signal 48 to ground potential ($V_{ss}$) as indicated by portion 49 thereof. After a predetermined number, e.g., seven in FIG. 2, of successive positive-going transitions in reference frequency signal 15, the $Q_8$ output signal 46 from the last stage of shift register 36 assumes the logic one state, thereby resetting FF 34. The seventh successive positive going transition is indicated by numeral 54 in FIG. 2. As the $\overline{Q}$ output signal 42 of FF 34 assumes a positive state each stage of shift register 36 is, in response, also reset. Accordingly, the $Q_1$ output signal 44 of shift register 36 assumes a logic zero level and buffer output signal 48 is clamped to a voltage level equal to stable reference voltage Vdd. Such voltage levels ae maintained until the next succeeding positive going transition 56 in VCO output signal 11, whereby FF 34 is set and the above described cycle restarted.

It should be noted that buffer output signal 48 has a period equal to the period of VCO output signal 11, i.e. $1/f_{VCO}$. During one cycle, signal 48 maintains a ground potential voltage for a predetermined period, $T_1$, corresponding to the above-mentioned predetermined number (seven in FIG. 2) of cycles of reference frequency signal 15. For the remainder of the cycle, signal 48 maintains a voltage equal to stable reference voltage Vdd. Thus, the duty cycle, and hence average voltage, of signal 48 is directly proportional to the period of VCO output signal 11, and, accordingly, decreases with increasing $f_{VCO}$. The average voltage of signal 48 may be expressed mathematically as:

$$V_f = (1 - T_1 f_{VCO}) V_{dd} \quad (1)$$

As noted above, low pass filter 18 serves to provide such an average voltage $V_f$. The gain $\Delta V_f / \Delta f_{VCO}$ in volts per Hz of digital discriminator 12, may thus be expressed:

$$\frac{\Delta V_f}{\Delta f_{VCO}} = -T_1 V_{dd} = -K_d V_{dd} \quad (2)$$

where $K_d$ equals $T_1$. Thus digital discriminator 12 provides a continuous and linear feedback signal $V_f$ to VCO 10. Such a linear and continuous feedback signal is essential for providing a frequency generator with a linear and continuous frequency response.

Mathematical analysis of frequency generator 100 shows that the response of frequency generator 100 is linear and continuous and the frequency deviation from the center frequency of the VCO can be made broad, as will now be explained. The closed loop gain $A_{CL}(j\omega)$ of frequency generator 100 in Hz/volt may be expressed:

$$A_{CL}(j\omega) = \frac{f_{VCO}}{V_{in}} = \frac{K_0/j\omega\, R_i C}{1 - \left[\frac{K_0 K_d V_{dd} f(d)}{j\omega\, R_f C}\right]} \quad (3)$$

where $K_0$ is the gain of VCO 10, the transfer function of integrator 28 is $1/j\omega C$, $[-K_d V_{dd}]$ is the gain of one shot 16 as explained above, and $f(d)$ is the transfer function of low pass filter 18. Low pass filter 18 is chosen to have a break frequency which is much higher than the closed loop bandwidth of frequency generator 100. Accordingly, the transfer function $f(d)$ of low pass filter 18 may be approximated by 1, whereby equation (3) simplifies to:

$$A_{CL}(j\omega) = \frac{R_f/(R_i K_d V_{dd})}{-1 + j\omega/\left(\frac{R_f C}{K_0 K_d V_{dd}}\right)} \quad (4)$$

Thus, frequency generator 100 maintains the closed loop response of a basic single pole network, having a closed loop break frequency $\omega_b$ in radians/second equal to $$\omega_b = \frac{R_f C}{K_0 K_d V_{dd}} \quad (5)$$

For frequencies small in comparison to $\omega_b$, the gain of frequency generator 100 is determined by the values $R_i$ and $R_f$ of resistors 22 and 26 and the gain Kd of digital one shot 16, all of which factors are constants not subject to drifts due to age, temperature or radiation. Thus, frequency generator 100 is both stable and linear in response with respect to frequencies up to the closed loop break frequency $\omega_b$. By choosing components such that $\omega_b$ is high, a wide-band linear frequency generator is obtained.

A frequency generator in accordance with the present invention has been implemented utilizing RCA COS/MOS integrated circuits: A portion of RCA CD4046 for VCO 10, RCA CD4013 for FF 34, RCA CD4015 for shift register 36, and RCA CD4049 for inverting buffer 38. A summing integrator was utilized comprising a National Signetics LM108 operational amplifier. Crystal oscillator 14 supplied a 512 KHz clock signal 15 and the predetermined time period $T_1$ consisted of eight cycles of the 512 KHz clock. VCO 10 maintained a center frequency of 14.5 KHz with a ±7.5% deviation from center frequency. The frequency generator response was measured to be within the order of 1 Hz RMS of a linear response over such frequencies. Input voltage $V_{in}$ ranged from zero to five volts, with VCO 10 operating at center frequency in response to an input voltage $V_{in}$ of 2.5 volts. Low pass filter 18 comprised two serially connected RC, single pole filters, and was configured such that the break frequency of filter 18 was approximately 2.5 KHz; approximately 10 times a desired closed loop bandwidth of 220 Hz.

What is claimed is:

1. In a linear wide-band controllable frequency generator of the type including a voltage controlled oscillator (VCO) for generating a signal having a frequency in accordance with a control signal applied thereto, and a control loop, said control loop including a source of stable frequency reference signal, a frequency discriminator receptive of said VCO signal, and a summing integrator, receptive of an input signal and the output signal of said discriminator, for generating said control signal, the improvement wherein said frequency discriminator comprises:

shift register means including a plurality of stages in a succession and including reset means for resetting the content of said stages to a predetermined value in response to a reset signal, the first stage in said succession admitting new content and each successive stage receiving the previous content of the next prior stage in said succession responsive to each cycle of said stable frequency reference signal, said shift register means providing first, and second register output signals indicative respectively of the content of said first stage and of the content of said last stage; said first and second register output signals alternating in voltage between first and second predetermined levels;

bistable means, for generating a first output signal in response to said VCO signal and a second output signal in response to said second register output signal, said bistable means first output signal being applied to said shift register means for admission as new content to the first stage in said succession, said bistable means second output signal being applied as reset signal to said shift register means reset means; and averaging means, responsive to said first register output signal, for generating a feedback signal representative of the average voltage of said first register output signal, said feedback signal being applied to said summing integrator as said dicriminator output signal.

2. The frequency generator of claim 1 wherein said averaging means comprises a low pass filter.

3. The frequency generator of claim 1 wherein said shift register means comprises a plural stage shift register including said succession of first through last stages and having a data input terminal and a reset terminal, and said bistable means comprises a resettable flip-flop generating Q and $\overline{Q}$ output signals;

said flip-flop being adapted to set in response to transitions in a given direction in said VCO output signals and to reset in response to said second register output signal;

said flip-flop Q output signal being applied to said shift register data input terminal and said flip-flop $\overline{Q}$ signal being applied to said shift register reset terminal.

4. The frequency generator of claim 3 wherein said averaging means comprises a low pass filter.

5. The frequency generator of claim 3 wherein said shift register means further includes inverting buffer means, connected between said shift register first stage and said averaging means, for generating a signal alternating between first and second stabilized voltage levels in accordance with the complement of the content of said shift register first stage.

6. In a linear wide-band controllable frequency generator of the type including a voltage controlled oscillator (VCO) for generating a signal having a frequency in accordance with a control signal applied thereto, and a control loop, said control loop including a source of stable frequency reference signal, a frequency discriminator, receptive of said VCO signal, and a summing integrator, receptive of an input signal and the output signal of said discriminator, for generating said control signal, the improvement wherein said frequency discriminator comprises:

first means for generating a first means output signal alternately of first and second predetermined amplitudes and having a duty cycle in accordance with the ratio of the period of said reference frequency and the period of said reference frequency, said first means including a flip-flop and a shift register having a plurality of stages, said flip-flop being receptive of said VCO signal and a signal from a given stage of said shift register, for generating first and second flip-flop output signals, said flip-flop first output signal having a voltage level representative of a predetermined logic state for a time period beginning at a transition in said VCO signal and continuing for said predetermined number of full cycles of said reference frequency signal occurring thereafter, and said flip-flop second output signal being indicative of transitions from said predetermined logic state in said flip-flop first output signal, said shift register being receptive of said flip-flop first and second output signals and said reference frequency signal and sequentially shifting, in response to said reference signal, the value of said flip-flop first output signal to the successive stages of said register while said first flip-flop signal is of said predetermined logic state and resetting each of said stages in response to a transition in said flip-flop second output signal, said first means output signal being representative of said signal from said given register stage; and said discriminator further comprising averaging means, responsive to said first means output signal for generating a feedback signal representative of the average voltage of said first means output signal, said feedback signal being applied to said summing integrator as said discriminator output signal.

* * * * *